(12) United States Patent
Glockler

(10) Patent No.: US 7,618,009 B2
(45) Date of Patent: Nov. 17, 2009

(54) APPARATUS FOR ATTACHMENT OF A UNIT TO ATTACHMENT DEVICES IN A VEHICLE

(75) Inventor: Gerd Glockler, Weidenstetten (DE)

(73) Assignee: Intergraph Technologies Company, Las Vegas, NV (US)

( * ) Notice: Subject to any disclaimer, the term of this patent is extended or adjusted under 35 U.S.C. 154(b) by 586 days.

(21) Appl. No.: 11/084,798

(22) Filed: Mar. 18, 2005

(65) Prior Publication Data

US 2005/0224651 A1    Oct. 13, 2005

(30) Foreign Application Priority Data

Mar. 20, 2004    (DE) .................. 10 2004 013 878

(51) Int. Cl.
*B64C 1/22*    (2006.01)
(52) U.S. Cl. .................. 244/118.1; 244/118.6
(58) Field of Classification Search ............ 244/118.1; 211/26; 248/279.1, 285.1, 286.1, 287.1
See application file for complete search history.

(56) References Cited

U.S. PATENT DOCUMENTS

| | | | | |
|---|---|---|---|---|
| 2,933,127 A | * | 4/1960 | Brewster | 297/216.2 |
| 3,306,234 A | * | 2/1967 | Hansen et al. | 410/55 |
| 3,730,469 A | * | 5/1973 | Shields | 248/265 |
| 3,876,174 A | * | 4/1975 | Culver | 248/279.1 |
| 4,185,799 A | * | 1/1980 | Richards, Jr. | 244/118.5 |
| 4,771,969 A | * | 9/1988 | Dowd | 244/118.6 |
| 4,911,381 A | * | 3/1990 | Cannon et al. | 244/122 R |
| 4,932,816 A | * | 6/1990 | Ligensa | 410/105 |
| 5,058,829 A | * | 10/1991 | Bentley | 244/122 R |
| 5,152,578 A | * | 10/1992 | Kiguchi | 297/216.16 |
| 5,178,346 A | * | 1/1993 | Beroth | 244/122 R |
| 5,407,165 A | * | 4/1995 | Balocke | 248/429 |
| 5,449,132 A | * | 9/1995 | Gilbert | 244/122 R |
| 5,499,783 A | * | 3/1996 | Marechal | 244/122 R |
| 5,520,357 A | * | 5/1996 | Payne et al. | 244/118.1 |
| 5,531,404 A | * | 7/1996 | Marechal | 244/118.6 |
| 5,676,336 A | * | 10/1997 | Nefy et al. | 244/122 R |
| 5,871,318 A | * | 2/1999 | Dixon et al. | 410/105 |
| 5,890,768 A | * | 4/1999 | Beurteaux et al. | 297/463.1 |

(Continued)

FOREIGN PATENT DOCUMENTS

JP          04201635 A  *  7/1992

OTHER PUBLICATIONS

Hanger warehouse, various hangers, Jul. 27, 2003, via internet archive http://web.archive.org/web/20030727132539/http://hanger-warehouse.com/hangers.htm.*

(Continued)

*Primary Examiner*—Michael R Mansen
*Assistant Examiner*—Joseph W Sanderson
(74) *Attorney, Agent, or Firm*—Sunstein Kann Murphy & Timbers LLP

(57) ABSTRACT

An apparatus for attachment of a unit to attachment devices in a vehicle, in particular an aircraft, has attachment elements which are provided for connection to the attachment devices. In this case, at least one attachment adapter is provided, and can be connected on the one hand to the unit to be attached and on the other hand by means of the attachment elements to at least one attachment device.

5 Claims, 9 Drawing Sheets

U.S. PATENT DOCUMENTS

| | | | | |
|---|---|---|---|---|
| 6,007,036 A * | 12/1999 | Rosen | ..................... | 248/286.1 |
| 6,086,154 A * | 7/2000 | Mathey et al. | ............... | 297/341 |
| 6,158,811 A * | 12/2000 | Hofschulte et al. | .......... | 297/362 |
| 6,260,813 B1 * | 7/2001 | Whitcomb | ............... | 248/503.1 |
| 6,412,864 B1 * | 7/2002 | Larson | ................... | 297/216.2 |
| 6,565,151 B2 * | 5/2003 | Jarnail et al. | ........... | 297/216.16 |
| 6,629,730 B2 * | 10/2003 | Makosa | ...................... | 297/341 |
| 6,648,292 B2 * | 11/2003 | Flick et al. | ................. | 248/430 |
| 6,648,393 B1 * | 11/2003 | Milnar et al. | ............ | 296/65.11 |
| 6,659,402 B1 * | 12/2003 | Prochaska | ................ | 244/118.6 |
| 6,892,995 B2 * | 5/2005 | Tame et al. | ................. | 248/429 |
| 6,926,364 B2 * | 8/2005 | Cooley et al. | .......... | 297/378.12 |
| 7,021,596 B2 * | 4/2006 | Lory | .......................... | 248/429 |
| 7,070,155 B2 * | 7/2006 | Garrido et al. | .............. | 248/424 |
| 7,172,155 B2 * | 2/2007 | Feist et al. | ................ | 244/118.6 |
| 7,334,758 B2 * | 2/2008 | Williamson et al. | ....... | 244/118.6 |
| 7,370,832 B2 * | 5/2008 | Frantz et al. | ............. | 244/118.6 |

OTHER PUBLICATIONS

"Spherical Flange Nut Assemblies" Newman Tools Inc, Dec. 2002 http://www.newmantools.com/teco/sfna.htm.*

* cited by examiner

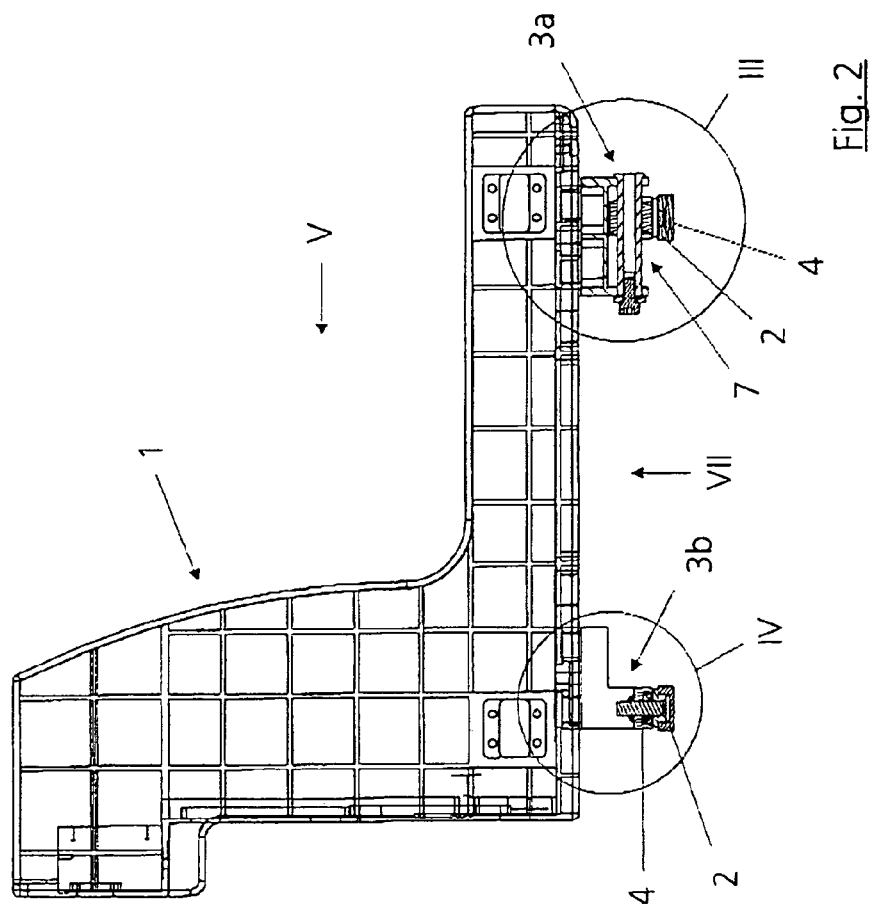
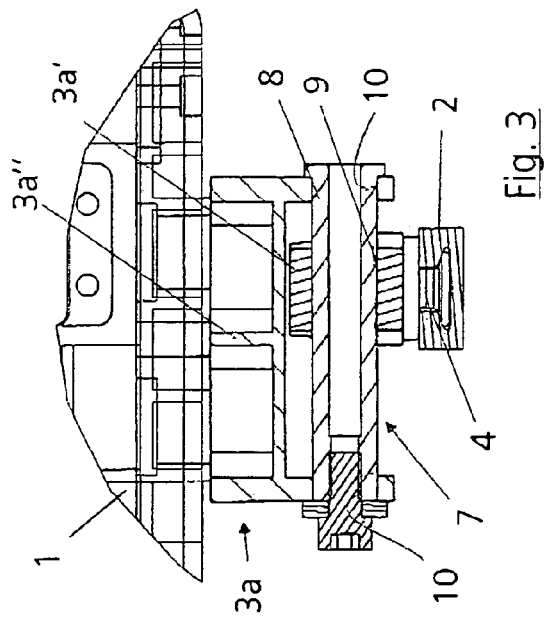
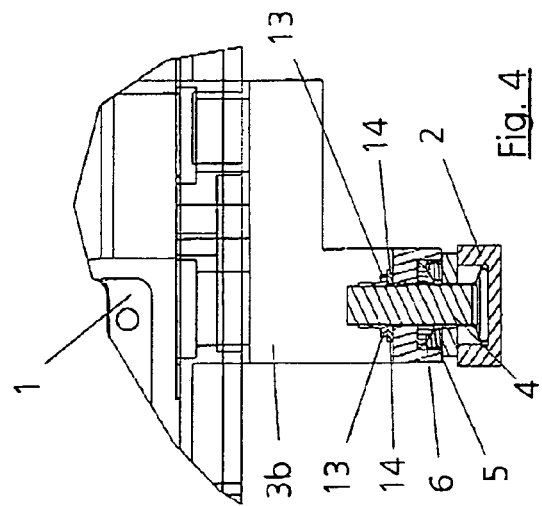

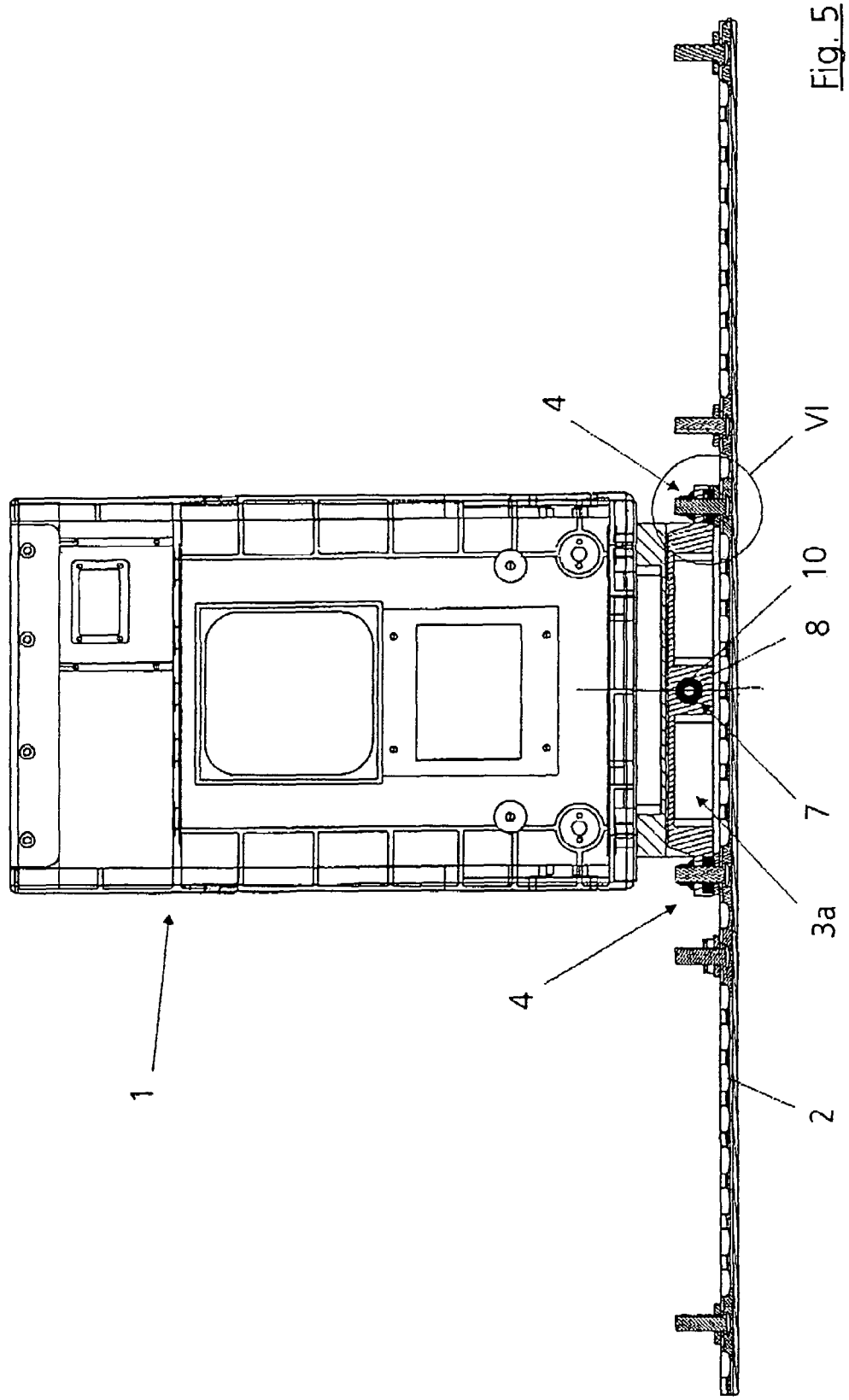

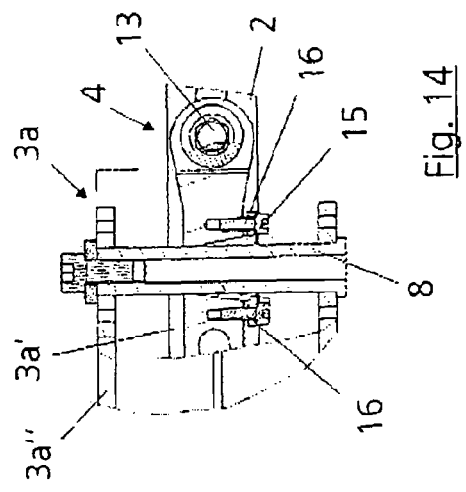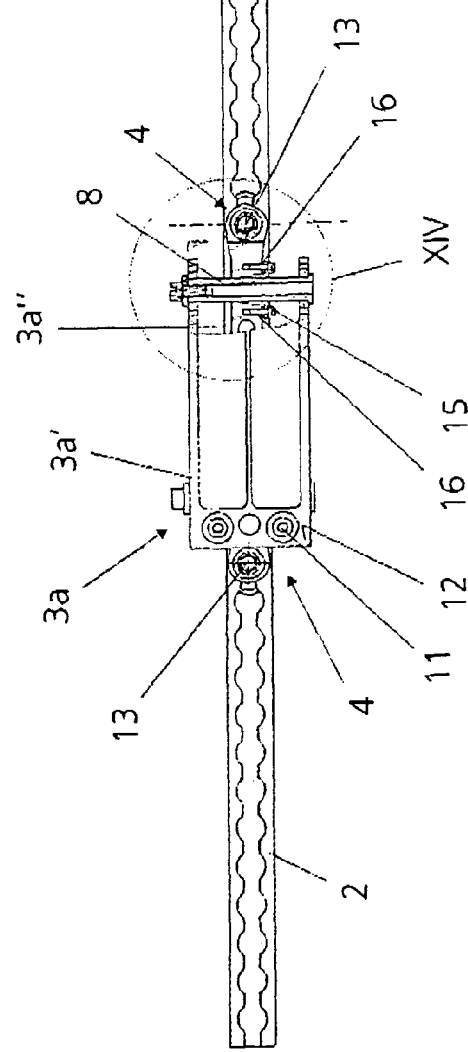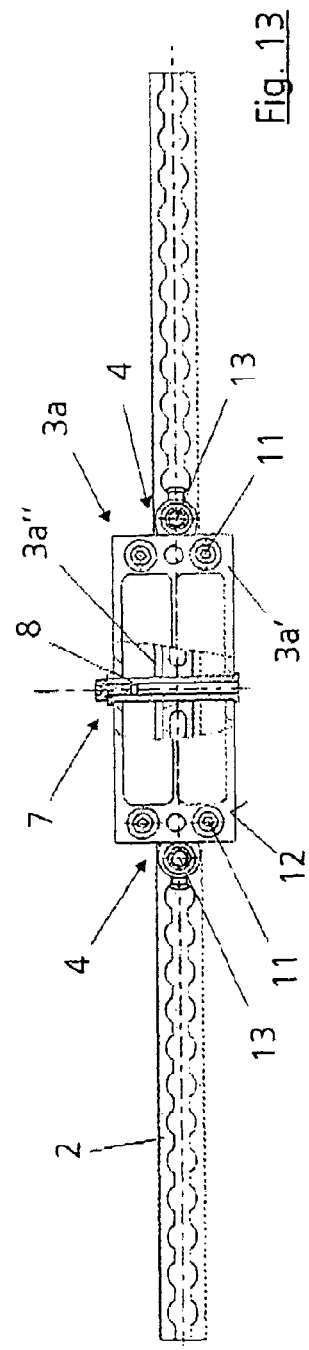

APPARATUS FOR ATTACHMENT OF A UNIT TO ATTACHMENT DEVICES IN A VEHICLE

CROSS REFERENCE TO RELATED APPLICATIONS

This application claims priority under 35 U.S.C. § 119 to German Patent Application Number 10 2004 013 878.8 filed Mar. 20, 2004.

BACKGROUND OF THE INVENTION

1. Field of the Invention

The invention relates to an apparatus for attachment of a unit to attachment devices on a vehicle, in particular an aircraft, having attachment elements which are provided for connection to the attachment devices.

2. Description of the Related Art

It is known from the general prior art for units which are intended to be fitted to attachment devices in a vehicle to be screwed on by means of attachment elements, or to be connected in some similar manner. For this purpose, the vehicles generally have attachment devices which are arranged at more or less regular intervals with respect to one another. The attachment devices may in this case, for example, be rails, and may be arranged in the floor area of the interior of the vehicle.

In aircraft, the attachment devices are normally attachment rails or seat rails. In this case, a large number of seat rails are provided, running essentially parallel to one another. Attachment elements which are in the form of seat rail fittings are used for attachment of aircraft seats. These seat rail fittings are specifically designed for connection to the seat rails, and are locked at the appropriate point in the seat rail, and are then screwed to the aircraft seat. In this case, in order to arrange it robustly, the seat is normally screwed to two seat rails running parallel to one another. The attachment points for the seats are in this case matched to the distance between the seat rails in the aircraft in which they are intended to be fitted. Since the distance between the seat rails is dependent on the aircraft type and on individual configuration wishes, no units which are not specifically matched to the seat rails of the respective aircraft or to the distance between them can be fitted to the seat rails or between two seat rails. Units which do not match the predetermined grid between the seat rails therefore often have to be fitted in the aircraft in an inadequate manner.

Particularly with regard to the arrangement of so-called hard disk stores or flight data recorders in an aircraft or in some other vehicle, the attachment is subject to particularly stringent requirements. Since data is stored in the hard disk store or flight data recorder during flight, it is essential that these units be connected robustly and reliably to the aircraft. This is particularly true when data from a digital camera is stored in the flight data recorder during a photographic flight by an aircraft. This data may, for example, be image data, supplementary data relating to the images, such as mission data, system information or information for post-processing. The flight data recorder is generally in the form of a bulk store for the "digitally mapping camera".

Electrically and mechanically, every flight data recorder is an autonomous unit which is connected to the digital camera via an image data connection.

Once the flight data recorder has been mechanically connected to the aircraft, the necessary cables must be connected to the flight data recorder in a further process. After landing, the flight data recorder is removed, and the image data is copied to a ground-based bulk store.

The known flight data recorders have the disadvantage that they can be mechanically connected only inadequately to the aircraft. Furthermore, the flight data recorder is subject to corresponding loads, which have a negative effect on functionality, as a result of twisting and stressing that occurs during flight. A further disadvantage is that flight data recorders are used in different aircraft types, so that a suitable attachment solution must be looked for on each individual occasion. Since each of the aircraft types have different seat rail separation, the flight data recorder cannot be arranged on seat rails.

A further disadvantage is that it is often very difficult to connect the flight data recorder to the cables which continue onwards, owing to the confined spatial conditions in the aircraft. Incorrect connection of cables can in this case lead to a malfunction. In this case, it is also particularly important for the plug connections to be reliable, in particular to be resistant to vibration and impacts, since, otherwise, there is a risk of the connections accidentally becoming loose as a result of movements of the aircraft during flight.

SUMMARY OF THE INVENTION

The present invention is based on the object of providing an apparatus for attachment of a unit to attachment devices in a vehicle, in particular in an aircraft, which overcomes the disadvantages of the prior art mentioned above, in particular allowing reliable and robust attachment of the unit, irrespective of the type of vehicle and of the arrangement of the attachment devices.

According to the invention, this object is achieved by an apparatus for attaching a unit to an attachment device in a vehicle, such as an aircraft, by way of attachment elements which have at least one attachment adapter which can be connected to the unit and to at least one attachment device, respectively.

Since the unit to be attached can be connected to the attachment device by means of at least one attachment adapter, the unit can be attached to attachment devices arranged in any desired manner by choosing an appropriately suitable attachment adapter and its configuration. In one refinement of the attachment devices as attachment rails or seat rails for a vehicle, for example an aircraft, it is possible to match the unit to be attached to the distance between the rails in the intended aircraft by the choice of an appropriate attachment adapter. The unit to be attached can thus be produced identically for all vehicle types. A suitable attachment adapter is then used, matched to the various attachment devices. In this case, it is also possible to provide for the attachment adapter to have the capability to be adjusted, and thus to be matched to different seat rail separation.

The unit to be attached can now be attached to seat rails in the aircraft in a particularly advantageous manner. This results in a particularly robust and reliable connection. Until now, such an arrangement was impossible or would have resulted in the unit to be attached having to be produced specifically matched to the distance between the seat rails. However, this involves complex design and causes high additional costs. The seat rails represent one of the most secure and robust attachment options in an aircraft. In general, the seat rails are also arranged virtually throughout the aircraft, so that the unit to be attached can be fitted or installed at any desired position in the aircraft.

It is advantageous for the unit to be attached to be an adapter for a flight data recorder.

Particularly in the case of flight data recorders, robust and secure connection to the aircraft is particularly important, since data is stored in the flight data recorder during flight. Until now, the flight data recorder was normally screwed in some manner to a wall of the aircraft or to the floor, or was fitted there. It is now possible in a simple manner to install an adapter for holding the flight data recorder at any desired point in the aircraft on the seat rails, in a robust and secure form. For operation of the flight data recorder, it is simply inserted into the adapter, and is fixed there. The adapter may in this case be designed such that a connection is made to the cables which continue further, for example to a digital camera, when the flight data recorder is inserted into the adapter.

It is advantageous for two attachment adapters to be provided for attachment of the unit.

The use of two attachment adapters allows the unit to be attached to be arranged on two seat rails in a simple manner.

It is advantageous for at least one attachment adapter to allow a pivoting or tilting movement of the unit with respect to the attachment device.

Designing at least one attachment adapter such that it can pivot prevents stressing or twisting of the aircraft or of the seat rails being transmitted to the unit to be attached. This is particularly important when the unit to be attached is a flight data recorder.

In a further advantageous refinement of the invention, it may be advantageous for at least one attachment adapter to be essentially in two parts, in which case a first part of the attachment adapter can be connected via the attachment elements to the attachment device, and a second part of the attachment adapter can be connected to the unit, and in which case the two parts of the attachment adapter can be moved with respect to one another.

The two-part design of an attachment adapter and the capability of the two parts to move with respect to one another allow the attachment adapter to be matched in a simple manner to different distances between two attachment devices, for example two seat rails. Furthermore, stressing or twisting resulting from the movement of the vehicle as well as different thermal expansions between the unit and the seat rails and/or the vehicle can be compensated for. Stressing, twisting and thermal expansion thus lead to a compensating movement for example a sliding movement of the two parts of the two-part attachment adapter which can move with respect to one another.

The unit to be attached may, for example, be connected to a first seat rail by means of a fixed or rigid attachment adapter. As an alternative to this, the unit to be attached may, however, also be fitted directly to a first seat rail, that is to say without any attachment adapter. The unit is then connected to the second seat rail by means of the two-part attachment adapter. The attachment adapter can be set to the distance between the two seat rails by appropriately moving the two parts of the two-part attachment adapter with respect to one another, that is to say the distance between the rigid attachment adapter and the first seal rail can be increased or decreased. Since, however, the seat rails are often at different distances from one another, but these differences are in general not excessively great, adaptation can be carried out just by the capability to move the two parts of the two-part attachment adapter just to a relatively minor extent. Even a minimal movement capability or sliding capability is sufficient to compensate for stressing and the like.

Alternatively, it is also possible to provide for the connection between the unit and the first seat rail likewise to be made by means of a two-part attachment adapter.

According to the invention, it is possible to provide for the two-part attachment adapter which can be adjusted to different seat rail separations to allow a pivoting movement of the unit with respect to the attachment device. This may be done, for example, by providing an articulated joint via which the two parts of the attachment adapter are connected to one another. However, according to the invention, it is also possible to provide for the capability to move the attachment adapter or adapters with respect to one another such that it is possible to compensate for different distances between the attachment devices or seat rails without any pivoting movement being possible. On the other hand, it is also possible for the attachment adapter or adapters to allow a pivoting movement of the unit with respect to the attachment device without being in two parts allowing movement of the two parts with respect to one another. The design solutions for "capability to set an attachment adapter to the seat rail separation" and "pivoting or tilting movement in order to compensate for stressing" can also in consequence be provided independently of one another.

However, it is particularly advantageous for at least one of the attachment adapters by means of which the unit is connected to the attachment device to allow not only a pivoting movement but also a change in the separation.

Advantageous refinements and developments of the invention can be found in the other dependent claims.

One exemplary embodiment of the invention will be described in principle in the following text.

BRIEF DESCRIPTION OF THE DRAWINGS

FIG. 2 shows the apparatus according to the invention as shown in FIG. 1, in a side view in the installed state;

FIG. 3 shows an enlarged individual illustration based on the detail (III) from FIG. 2;

FIG. 4 shows an enlarged individual illustration based on the detail (IV) from FIG. 2;

FIG. 5 shows a front view of the apparatus according to the invention, looking in the direction of the arrow V in FIG. 2;

FIG. 13 shows a view of the apparatus according to the invention based on the alternative refinement illustrated in FIG. 9 from above—without the unit to be attached, and FIG. 14 shows an enlarged individual illustration based on the detail XIV in FIG. 13.

DETAILED DESCRIPTION

Figure 1:
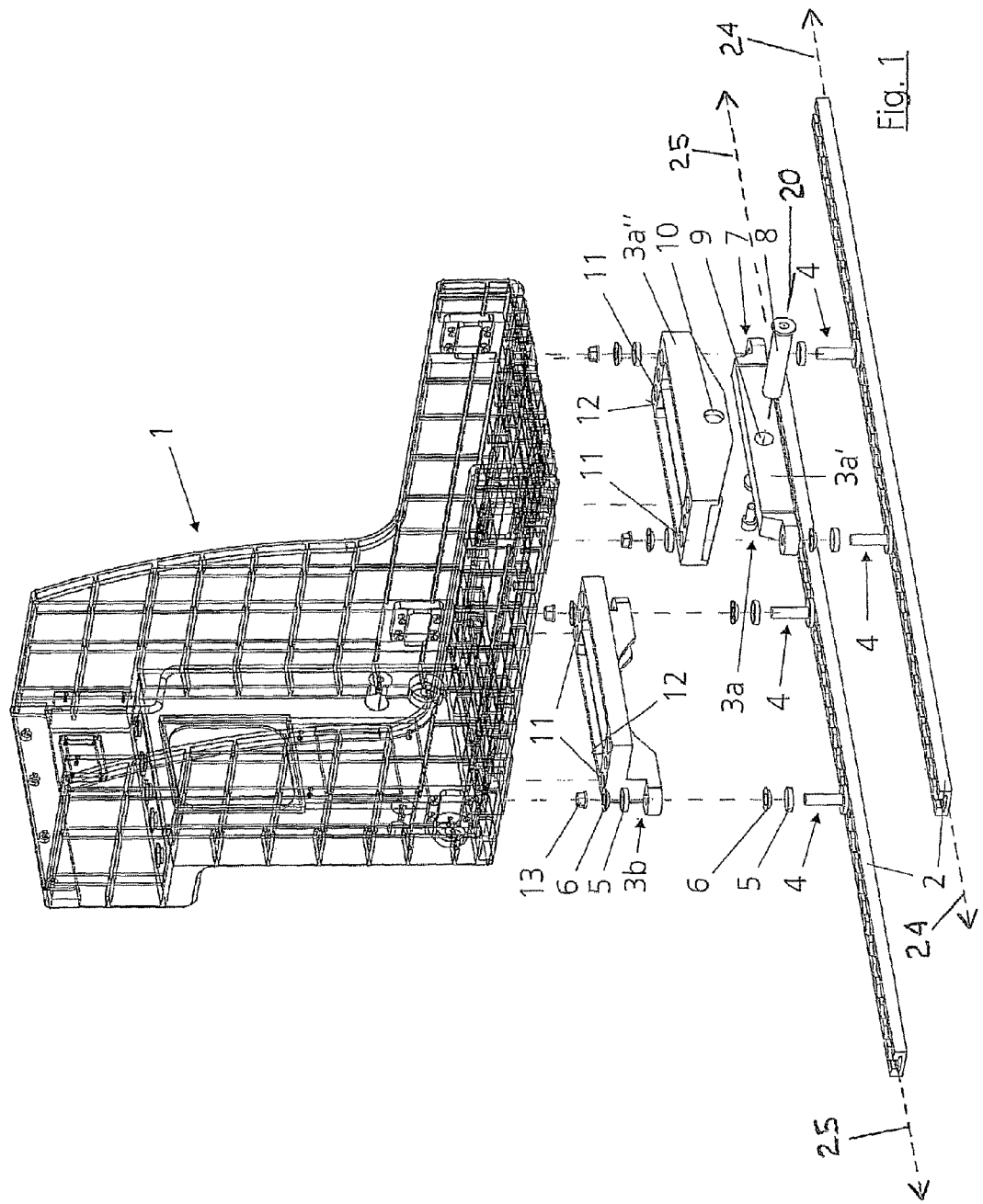
FIG. 1 shows the apparatus according to the invention with a unit to be attached and with two attachment devices in the form of rails, in the form of an exploded illustration.

The exemplary embodiment shows one option for use of the apparatus according to the invention. In this case, a unit 1 to be attached is in the form of an adapter for a flight data recorder, which is not illustrated in any more detail. The attachment devices 2 to which the adapter 1 is intended to be attached are in the form of attachment rails or seat rails 2 which, as shown in FIG. 1, have respective longitudinal axes 24 and 25. Provision is made in this case for the adapter 1 to be attached to two seat rails 2. The seat rails 2 in the exemplary embodiment represent seat rails in an aircraft which is equipped with further preparatory facilities for carrying out a photographic flight, for example a digital camera.

The exemplary embodiment shows only one of the possible fields of use for the apparatus according to the invention. In principle, the apparatus according to the invention can be used to attach any desired unit to attachment devices of any design, preferably attachment rails. These may be attachment devices or attachment rails in any desired vehicle. In this case, the expression vehicle is intended to mean not only land vehicle by also aircraft and water craft. The apparatus according to the invention is particularly suitable for use in vehicles which are normally provided with attachment rails, in particular with seat rails, as is the case, for example, in buses, military vehicles, goods vehicles and aircraft. The invention is not restricted to the embodiment illustrated in the exemplary embodiments.

FIG. 1 shows the adapter 1 that is provided for holding the flight data recorder and is intended to be attached to two seat rails 2. In this case, two attachment adapters 3a, 3b are provided, which can be connected on the one hand to the adapter 1 to be attached for the flight data recorder, and on the other hand to the seat rails 2. In this case, attachment elements 4 which are specifically matched to the seat rails 2 are provided for connection of the attachment adapters 3a, 3b to the seat rails 2. In the exemplary embodiment, the attachment elements are in the form of known seat rail fittings 4. As will be explained in more detail in the following text, the seat rail fittings 4 each have a conical cup 5 and a spherical washer 6. This makes it possible to correct for a minor discrepancy in the intended alignment of the seat rail fittings 4 and the seat rail 2 in a known manner.

In the exemplary embodiment, two seat rail fittings 4 are in each case provided for attachment of one attachment adapter 3a, 3b to a seat rail 2. As can be seen from FIG. 1, FIG. 2, FIG. 5, FIG. 7 and FIG. 8, an attachment adapter 3a is designed in such a way as to allow a pivoting movement of the adapter 1 with respect to the seat rails 2. The attachment adapter 3a which allows the pivoting movement for this purpose has an articulated joint 7 via which the adapter 1 is connected to the associated seat rail 2.

As can be seen from the figures, the articulated joint 7 if formed by a bolt 8 and holes 9, 10. The attachment adapter 3a in this case has two parts, with the two parts 3a' and 3a" being connected to one another by means of the bolt 8. A first part 3a' of the attachment adapter 3a is connected to the associated seat rail 2 via the seat rail fittings 4. The second part 3a" of the attachment adapter 3a is connected to the adapter 1 for the flight data recorder by means of a screw connection, which is not illustrated in any more detail.

Since the two parts 3a' and 3a" are connected to one another just via the bolt 8 which is centered on a pivot axis 20 which is oriented in a direction transverse to the longitudinal axes 24 and 25 of the seat rails 2 as in indicated in FIG. 1, the adapter 1 can carry out a slight pivoting or tilting movement about pivot axis 20 with respect to the seat rails 2 or a floor in the aircraft, in which the seat rails 2 are arranged. This prevents stressing or twisting being transmitted to the adapter 1 and thus, in consequence, to the flight data recorder as well.

As can be seen in particular from FIG. 1, the second part 3a" (which faces the adapter 1) of the attachment adapter 3a is in the form of a rocker, that is to say the part 3a" tapers in the direction of the adapter 1, starting from the hole 10 that is intended to hold the bolt 8. In consequence, the pivoting or tilting movement of the adapter 1 with respect to the seat rails 2 is not physically restricted by the second part 3a" of the attachment adapter 3a.

As can be seen from joint consideration of FIGS. 1 to 8, the adapter 1 is thus connected to the seat rails 2 via a three-point mounting (the two seat rails fittings 4 for the attachment adapter 3b and the bolt 8 for the attachment adapter 3a).

As can be seen from FIGS. 1 to 9, the two parts 3a' and 3a" of the attachment adapter 3a can move or slide with respect to one another.

As can be seen from FIG. 1 to FIG. 8, the invention provides for the adapter 1 to be connected to the seat rails 2 by means of a rigid attachment adapter 3b and an attachment adapter 3a which is essentially formed from two parts 3a', 3a". Since the two parts 3a' and 3a" can move with respect to one another in a direction oriented parallel to pivot axis 20, the distance between the seat rail fittings 4 of the two-part attachment adapter 3a and the seat rail fittings 4 of the rigid adapter 3b can be varied. The two-part attachment adapter 3a makes it possible to avoid stressing and twisting of the seat rails 2 and of the aircraft being transmitted to the adapter 1 and, instead of this, leading to a movement of the two parts 3a', 3a" of the two-part attachment adapter 3a with respect to one another. This therefore compensates for stressing and the like.

Figure 9:
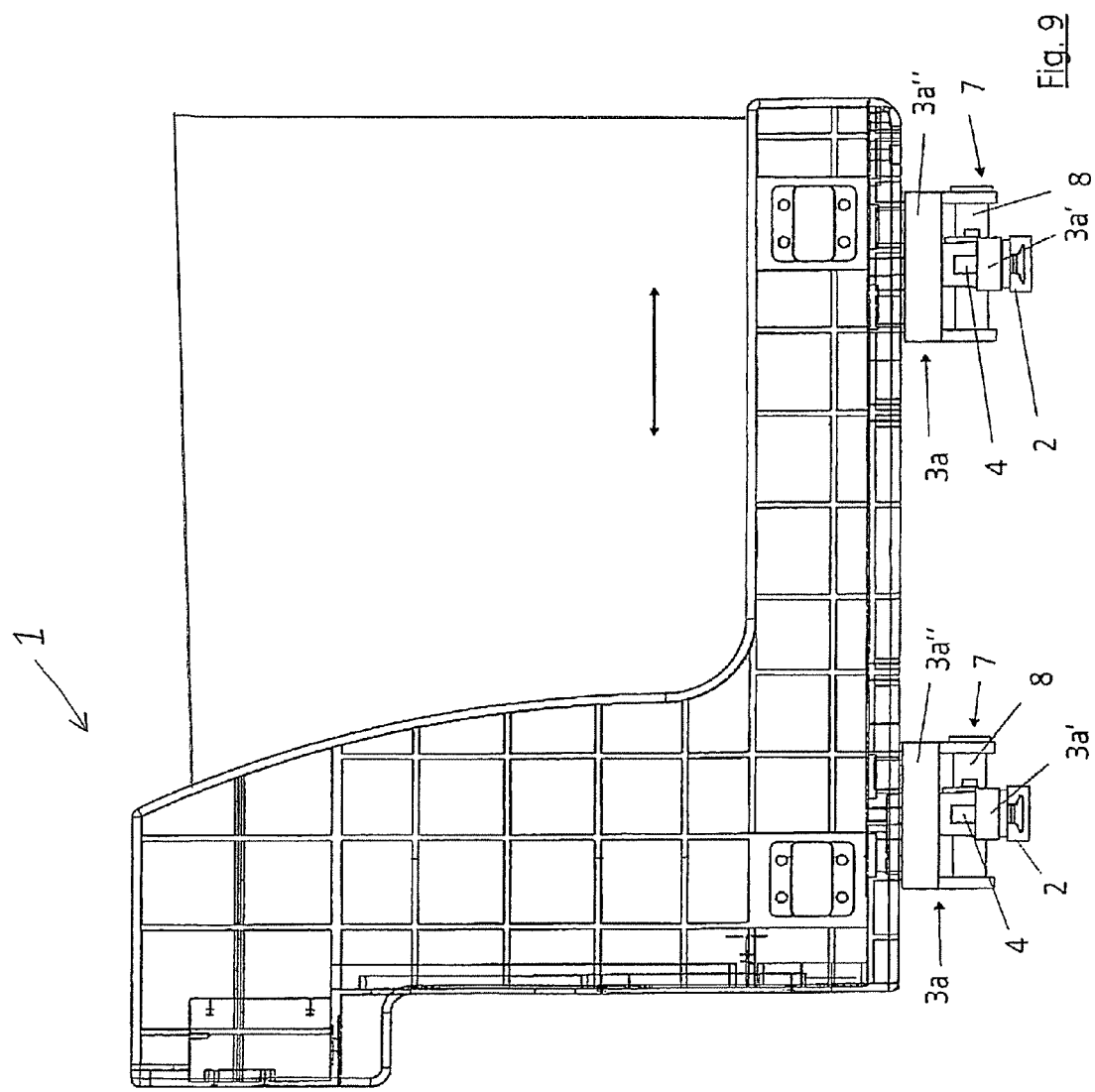
FIG. 9 shows a side view of an alternative refinement of the apparatus according to the invention with two attachment adapters which are each movable.

FIG. 9 shows the use of two attachment adapters 3a. The adapter 1 can thus also be attached to two seat rails 2 which are particularly close to one another or are particularly far apart from one another. As can be seen from FIG. 9, one of the two attachment adapters 3a (or alternatively both of them as well) is provided with two bolts 8. An attachment adapter 3a which is provided with two bolts 8 admittedly does not allow any pivoting movement of the adapter 1 with respect to the seat rails 2, but the refinement with two bolts 8 allows the adapter 1 to be arranged in a particularly secure and robust manner. As can be seen from FIG. 9, an attachment adapter 3a preferably has two bolts 8 and an attachment adapter 3a has only one bolt 8 (see FIG. 1). Once again, this results in an advantageous three-point mounting.

Figure 8:
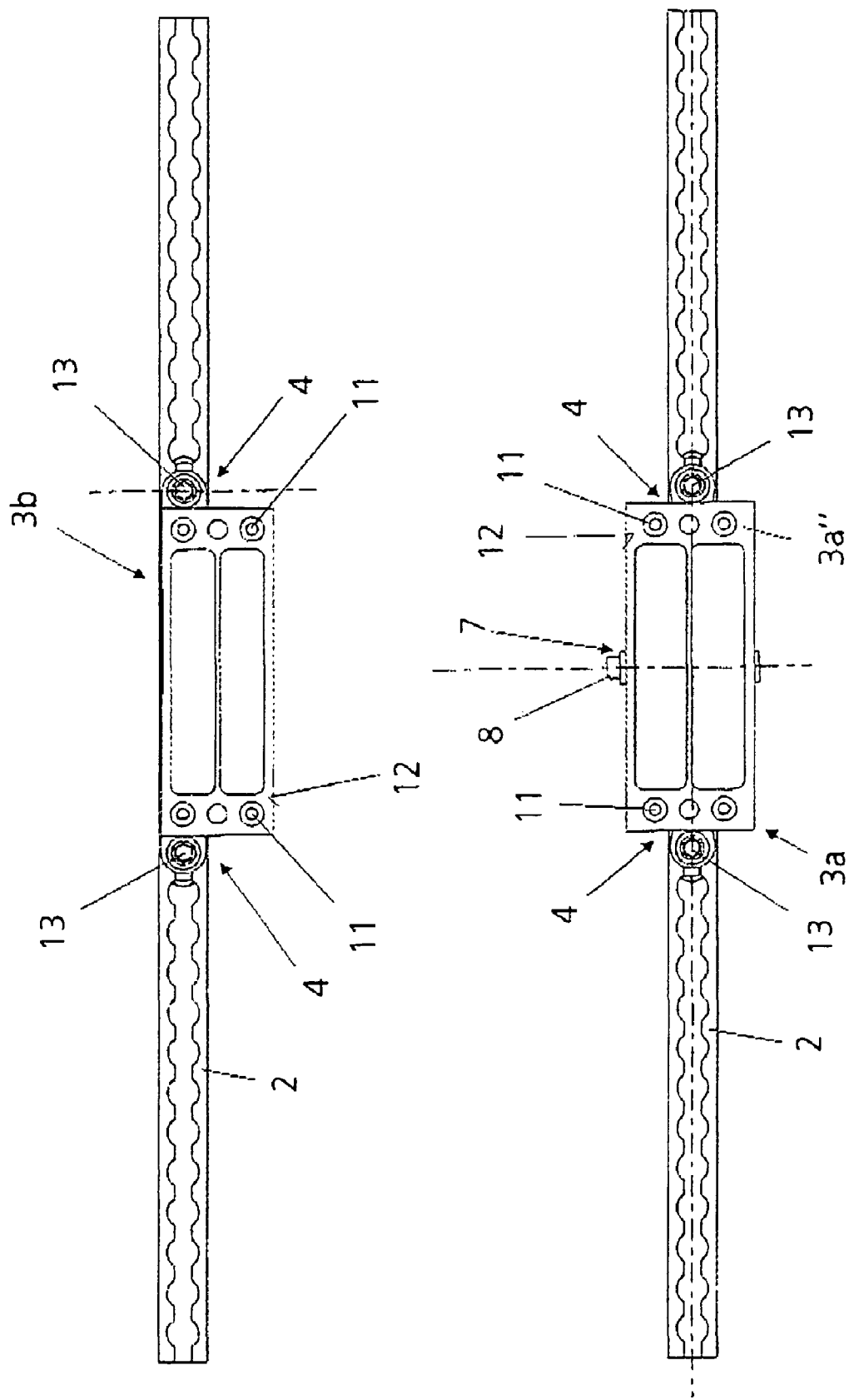
FIG. 8 shows a view of the apparatus according to the invention from above—without the unit to be attached.

As can be seen in particular from FIG. 1, FIG. 2 and FIG. 8, the attachment adapters 3a, 3b have two or more attachment holes 11 for connection to the adapter 1, allowing variable positioning of the attachment adapter 3a or 3b on the adapter 1. In order to allow stable mounting of the adapter 1 on the attachment adapter 3a, 3b, and thus of two or more attachment holes 11, the attachment adapters 3a, 3b have a correspondingly large contact area 12, which is in each case provided with the attachment holes 11.

As can be seen from FIGS. 1, 2 and 8, the contact surface 12 of the attachment adapter 3b is arranged asymmetrically with respect to the holes that are provided for the seat rail fittings 4 to pass through. In the exemplary embodiment, the contact surface 12 of the attachment adapter 3b is aligned in the direction of the attachment adapter 3a. In order to compensate for a particularly short distance between two seat rails 2, it is possible to provide in this case for the attachment adapter 3b to be mounted pivoted through 180°, that is to say for the contact surface 12 of the attachment adapter 3b to extend in the opposite direction to that of the attachment adapter 3a.

As is shown in FIG. 1, with regard to the installation of an adapter 1 for holding a flight data recorder, it is possible to provide for two seat rail fittings 4 to in each case be mounted in each of the respectively associated seat rails 2 in a first step. In this case, the seat rail fittings 4 are provided with a conical cup 5 and a spherical washer 6. The attachment adapter 3b and the first part 3a' of the attachment adapter 3a are then fitted. A further conical cup 5, a further spherical washer 6 and a nut 13 are then fitted to the respective seat rail fitting 4. The correspondingly associated attachment adapter 3b or the first part 3a' of the attachment adapter 3a is screwed on or attached by means of the nuts 13. The attachment adapter 3b can now be screwed directly to the adapter 1, using two or more of the attachment holes 11. Before the attachment adapter 3a can be connected to the adapter 1, the second part 3a" of the attachment adapter 3a also has to be connected to the first part 3a' of the attachment adapter 3a. To do this, the hole 9 in the first part 3a' and the holes 10 in the second part 3a' are moved such that they are aligned with one another and the bolt 8 is introduced and fixed appropriately. The first part 3a' is now connected to the second part 3a" via an articulated joint 7, which allows a pivoting movement of the adapter 1 with respect to the seat rails 2. The articulated joint 7 is in this case also used as a linear guide for the movement of the two parts 3a', 3a" with respect to one another. In a final process, the attachment adapter 3a or its second part 3a' can now be screwed to the adapter 1 via two or more attachment holes 11.

This results in the arrangement illustrated in FIG. 2.

FIG. 4 shows, in detail, the attachment adapter 3b with an illustration of a seat rail fitting 4. The arrangement of a conical cup 5 and a spherical washer 6 makes it possible to compensate for a minor discrepancy from the intended alignment of the seat rail fitting 4. In the illustrated exemplary embodiment, the seat rail fitting 4 is provided with a thread for the nut 13 to be screwed onto. In contrast to the embodiment shown in FIG. 1, only a washer 14 instead of a further conical cup 5 and a further spherical washer 6 is provided, as can be seen in FIG. 2 and FIG. 3, between the nut 13 and the corresponding hole through the attachment adapter 3b for the seat rail fitting 4.

FIG. 3 shows an enlarged illustration of the attachment adapter 3a. The capability to move the first part 3a' of the attachment adapter 3a with respect to the second part 3a" and thus to take account of different distances between two seat rails 2 and to carry out a sliding movement in order to compensate for stressing, is clearly evident in this case. In this case, the two parts 3a' and 3a" move with respect to one another along the axis of the bolt 8.

FIG. 5 shows a view from the front of the attachment adapter 3a, with a plan view of the articulated joint 7 and the bolt 8.

Figure 6:
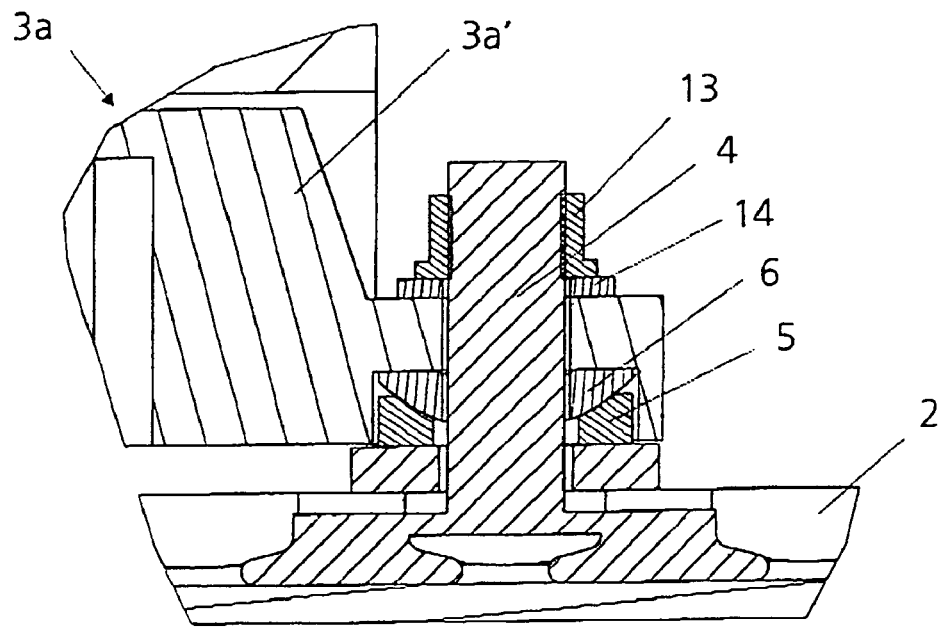
FIG. 6 shows an enlarged illustration of the detail VI from FIG. 5.

FIG. 6 shows the seat rail fitting 4 and the first part 3a' (which is arranged on it) of the attachment adapter 3a in an illustration rotated through 90° with respect to FIG. 4.

Figure 7:
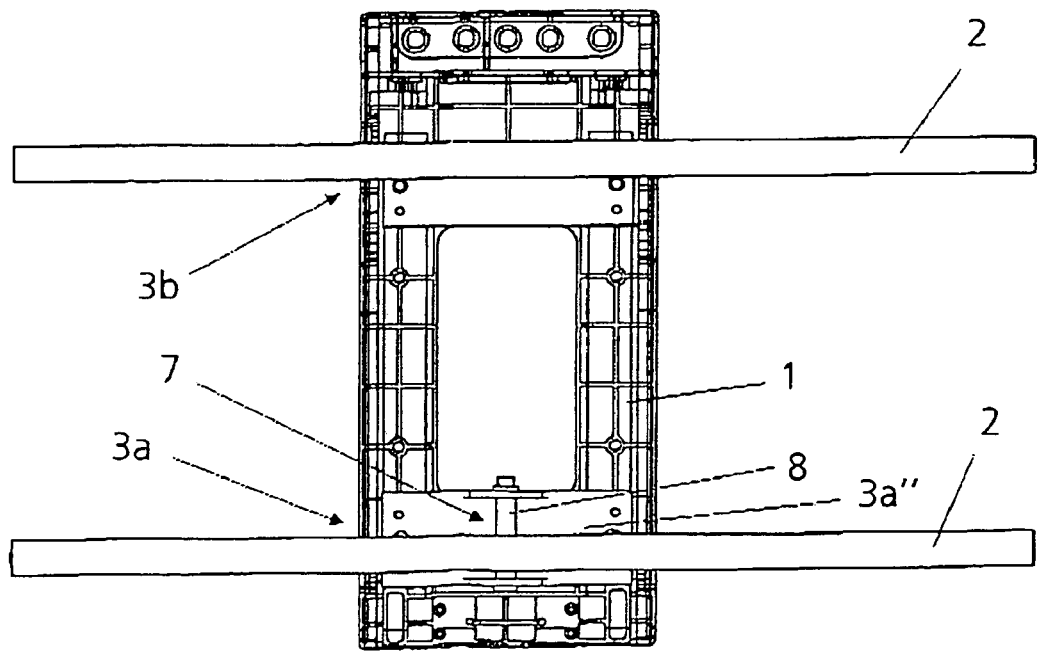
FIG. 7 shows an illustration of the apparatus according to the invention from underneath, in the direction of the arrow VII in FIG. 2.

FIG. 7 shows a view of the two attachment adapters 3a, 3b from underneath, clearly showing the pivoting capability of the attachment adapter 3a and the capability of the two parts 3a' and 3a" to move with respect to one another.

FIG. 8 shows a plan view of the two attachment adapters 3a, 3b in the state in which they are each attached to a seat rail 2.

FIG. 9 shows an alternative embodiment to that shown in FIGS. 1 to 8, in which the adapter 1 is attached to the seat rails 2 by means of two attachment adapters 3a in order to hold the flight data recorder.

The attachment adapters 3a, 3b are each arranged at the end of the adapter 1 in the exemplary embodiment. The attachment adapters 3a, 3b and their contact surfaces 12 in this case extend over the entire width of the adapter 1 in order to hold a flight data recorder. The attachment adapter 3b has a cross section with a U-shaped profile, with the attachment adapter 3b being provided with a through-hole in the area of its U-shaped ends, which is used for screwing to the associated seat rail 2.

As an alternative to the bolt 8, the attachment adapter 3a may also be provided with any other desired longitudinal guide which allows the adapter 1 to slide with respect to the attachment adapter 3a or its first part 3a' which is connected to the seat rail 2. The linear guidance required for this purpose may, for example, be in the form of a rail, a tongue and groove joint or the like. The only essential feature in this case is that the adapter 1 is not connected to the two seat rails 2 in a fixed or rigid manner, but can move with respect to at least one seat rail 2, so that it is possible to compensate for stressing.

Figure 10:
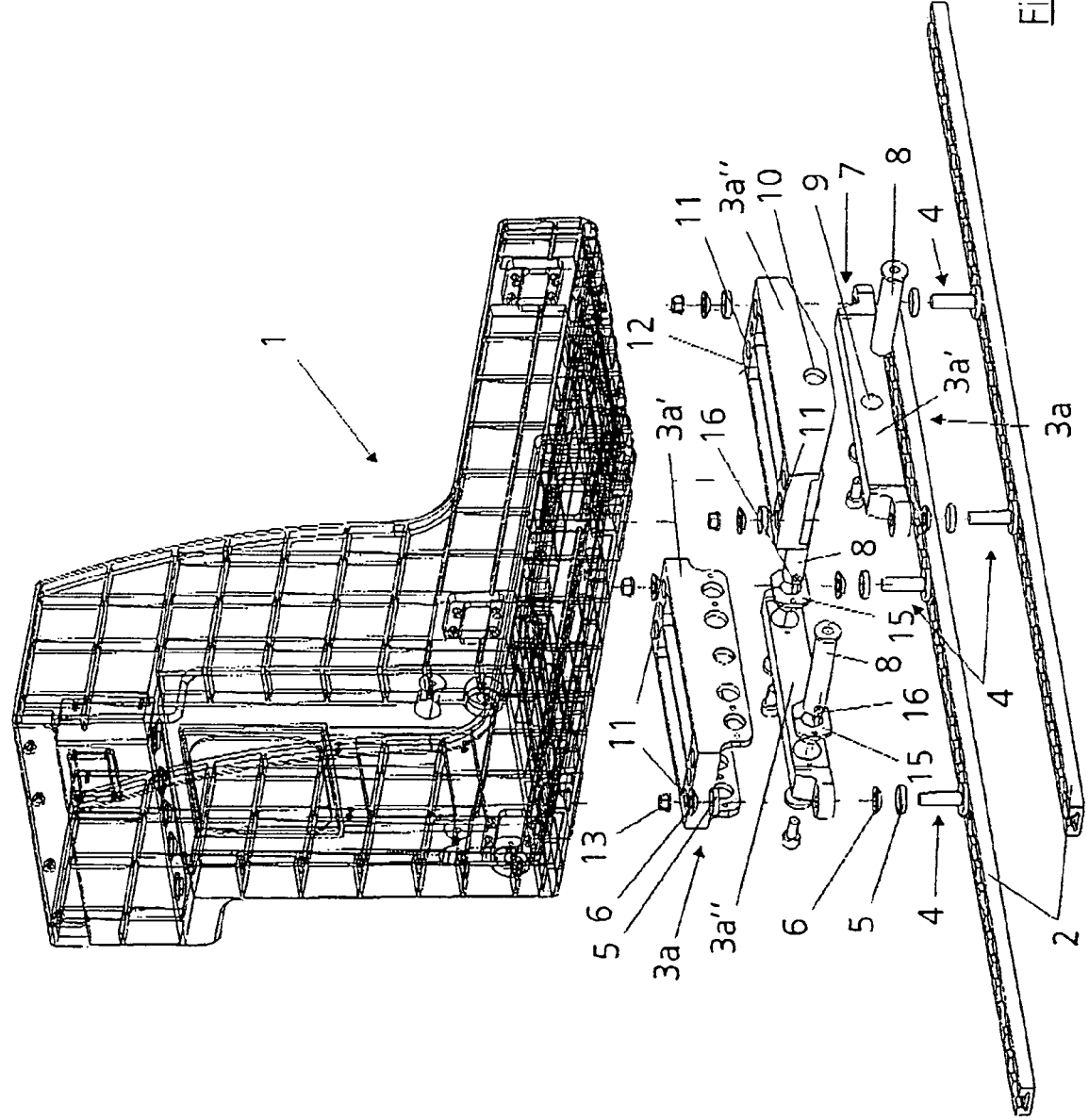
FIG. 10 shows an exploded illustration of the apparatus according to the invention, based on the alternative refinement illustrated in FIG. 9.

FIG. 10 shows an exploded illustration of the alternative embodiment illustrated in FIG. 9. The exploded illustration in FIG. 10 corresponds largely to the exploded illustration shown in FIG. 1, with the exception of the alternative embodiment of an attachment adapter, with the attachment adapter 3b as illustrated in FIG. 1 being replaced by an attachment adapter 3a which has two bolts 8. The attachment adapter 3a, which is illustrated with two bolts 8 in FIG. 10, has a first part 3a' for attachment to the adapter 1, and a second part 3a" for connection to the seat rail 2.

The alternative refinement according to the invention as illustrated in FIGS. 9 to 14 makes it possible for the adapter 1 for the flight data recorder also to move relative to the seat rail even after attachment to the seat rails 2. For fixing in the desired position, the attachment adapter 3a which is provided with the two bolts 8 has two conical sleeves 15, which can each be wedged in place via two fixing screws 16. Once the conical sleeves 15 have been wedged in place by the fixing screws 16, the adapter 1 is locked in the desired position.

Figure 11:
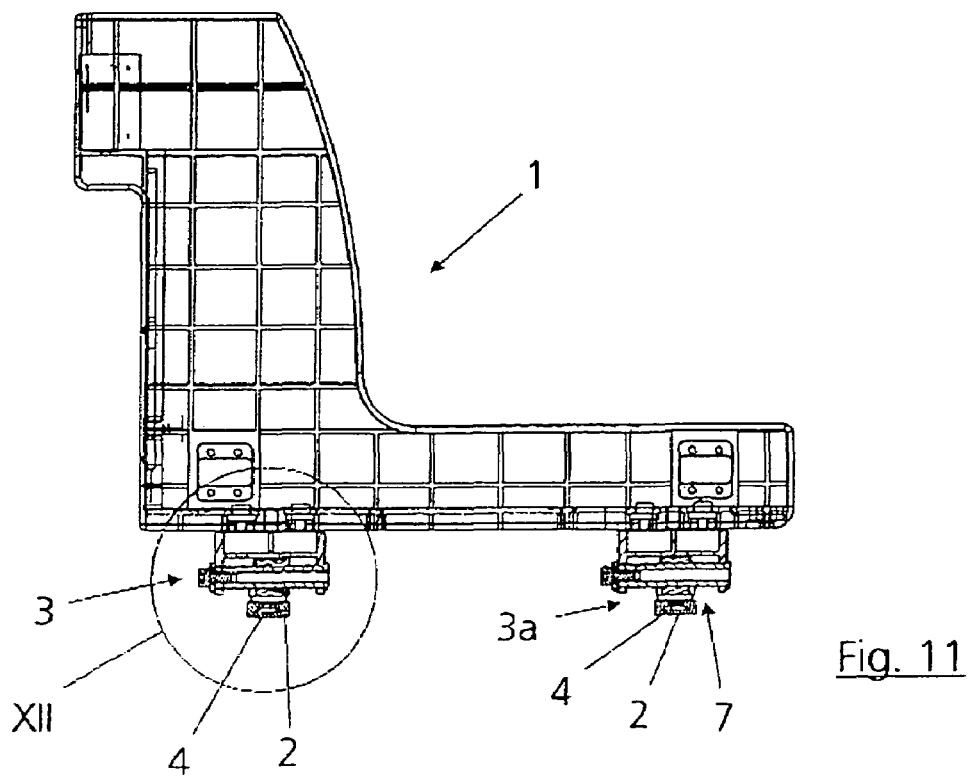
FIG. 11 shows a side view of the apparatus according to the invention based on the alternative refinement illustrated in FIG. 9, with a section illustration of the attachment adapter.
Figure 12:
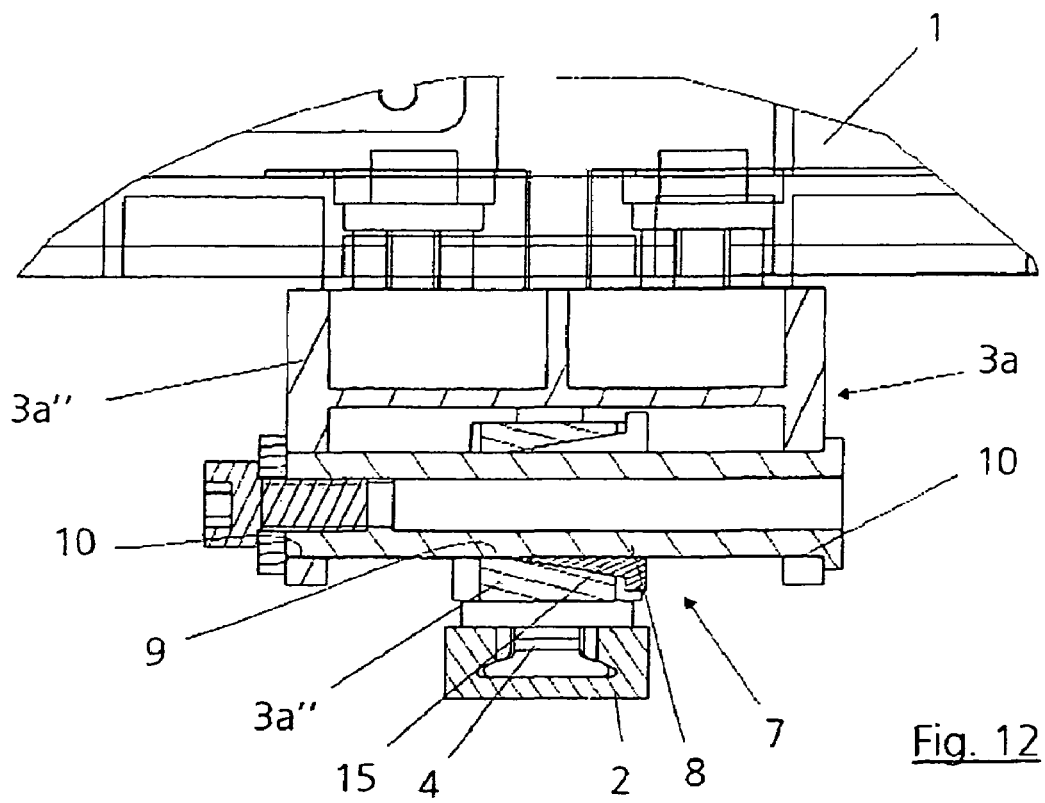
FIG. 12 shows an enlarged individual illustration corresponding to the detail XII in FIG. 11.

FIG. 11 and FIG. 12 show a cross section through the attachment adapter 3a provided with two bolts 8. In this case, FIG. 11 and FIG. 12 show the method of operation of the conical sleeves 15 for locking the bolts 8 to the second part 3a", as a result of which the adapter can no longer move with respect to the seat rails 2. The other parts which are illustrated in FIG. 11 correspond essentially to the parts which have already been described with reference to FIG. 2 and FIG. 3.

FIG. 13 shows a plan view of the two attachment adapters 3a corresponding to FIGS. 9 to 12 in a state in which they are each attached to one seat rail 2. An illustration such as this, with the exception of the attachment adapter 3a which is now used by way of alternative, has already been described with reference to FIG. 8 in terms of the embodiment of the apparatus according to the invention illustrated in FIGS. 1 to 8. FIG. 14 in this case shows an enlarged section illustration of the attachment adapter 3a in the area of its bolts 8. FIG. 13 and FIG. 14 show an illustration of a conical sleeve 15 which can be wedged to the bolt 8 by screwing the two fixing screws 16.

What is claimed is:

1. An apparatus for attaching an adapter for a flight data recorder to at least a first aircraft seat rail, the first aircraft seat rail being of the type having a first longitudinal axis, said apparatus, comprising:

a first attachment adapter having a first attachment adapter first part and a first attachment adapter second part; the first attachment adapter first part being connectable to the first aircraft seat rail for securing the first attachment first part to the first aircraft seat rail; the first attachment adapter second part being connectable to the adapter for a flight data recorder; the first attachment adapter also having a first articulated joint by way of which the first attachment adapter first part and the first attachment adapter second part are connected to one another; the articulated joint comprising a hole through one of the first attachment adapter first or second parts; the hole having a hole thickness in a direction generally parallel to the first pivot axis; the first articulated joint being configured to allow the first part and the second part to (i) pivot relative to one another about no more than a first pivot axis oriented transversely to the first longitudinal axis of the first aircraft seat rail and, (ii) be longitudinally moved at least a distance equal to the hole thickness with respect to one another in a direction oriented parallel to the first pivot axis.

2. The apparatus as claimed in claim 1 wherein the aircraft also has a second aircraft seat rail, the second aircraft seat rail having a second longitudinal axis, the apparatus further comprising: a second attachment adapter by way of which the adapter for a flight data recorder is connected to the second aircraft seat rail.

3. The apparatus as claimed in claim 2 wherein the second attachment adapter comprises:

a second attachment adapter first part and a second attachment adapter second part; the second attachment adapter first part being connectable to the second aircraft seat rail for securing the second attachment adapter first part to the second aircraft seat rail; the second attachment adapter second part being connectable to the adapter for a flight data recorder; the second attachment adapter also having a second articulated joint by way of which the second attachment adapter first part and the second attachment adapter second part are connected to one another in a manner allowing the second attachment adapter first part and the second attachment adapter second part to (i) pivot relative to one another about a second pivot axis oriented transversely to the second longitudinal axis and, (ii) be moved with respect to one another in a direction oriented parallel to the second pivot axis.

4. The apparatus as claimed in claim 3 wherein the second articulated joint includes a second bolt which is centered about the second pivot axis and passes through the second attachment adapter first part and the second attachment adapter second part and connects the second attachment adapter first part and the second attachment adapter second part to one another.

5. The apparatus as claimed in claim 2, wherein the second attachment adapter is essentially rigid, while the first attachment adapter compensates for at least one of stressing and twisting by allowing the first part and the second part of the first attachment adapter to pivot relative to one another about the first pivot axis.

* * * * *

UNITED STATES PATENT AND TRADEMARK OFFICE
CERTIFICATE OF CORRECTION

PATENT NO. : 7,618,009 B2  Page 1 of 1
APPLICATION NO. : 11/084798
DATED : November 17, 2009
INVENTOR(S) : Gerd Glockler It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1042 days.

Signed and Sealed this

Nineteenth Day of October, 2010

David J. Kappos
*Director of the United States Patent and Trademark Office*